(12) United States Patent
Li et al.

(10) Patent No.: US 8,793,516 B2
(45) Date of Patent: Jul. 29, 2014

(54) POWER SUPPLY UNIT AND POWER SUPPLY SYSTEM FOR SERVERS

(75) Inventors: Han-Yu Li, New Taipei (TW); Ning Zhang, Shenzhen (CN); Sheng-Ping Xie, Shenzhen (CN); Yun-Quan Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 230 days.

(21) Appl. No.: 13/332,514

(22) Filed: Dec. 21, 2011

(65) Prior Publication Data
US 2013/0111098 A1 May 2, 2013

(30) Foreign Application Priority Data
Oct. 31, 2011 (CN) .......................... 2011 1 0337332

(51) Int. Cl.
*G06F 1/26* (2006.01)
(52) U.S. Cl.
USPC ............................. 713/300; 307/43; 307/154

(58) Field of Classification Search
USPC ...................... 713/300; 307/43, 85, 150, 154; 361/695, 724, 752
See application file for complete search history.

(56) References Cited

U.S. PATENT DOCUMENTS

| | | | | |
|---|---|---|---|---|
| 5,842,030 A * | 11/1998 | Larabell et al. | ................ | 713/340 |
| 7,390,192 B2 * | 6/2008 | Graetz | ............................. | 439/61 |
| 7,840,824 B2 * | 11/2010 | Baba et al. | ..................... | 713/300 |
| 8,504,861 B2 * | 8/2013 | Sawai et al. | .................... | 713/340 |
| 2009/0147459 A1 * | 6/2009 | Nguyen et al. | ............ | 361/679.31 |
| 2012/0205976 A1 * | 8/2012 | Shih et al. | ......................... | 307/24 |
| 2013/0077209 A1 * | 3/2013 | Su et al. | ......................... | 361/622 |

\* cited by examiner

*Primary Examiner* — Glenn A Auve
(74) *Attorney, Agent, or Firm* — Novak Druce Connolly Bove + Quigg LLP

(57) ABSTRACT

A power supply unit for providing power to servers and a power supply system for servers is disclosed. The power supply unit for providing power to servers, comprises a housing; a plurality of power supplies arranged in the housing, the plurality of power supplies comprising a first output end and a second output end; a circuit board comprising a first conductive plate and a second conductive plate, the first conductive plate being electrically connected with the first output end, and the second conductive plate being electrically connected with the second output end; and an integrated management module electrically connected with the circuit board.

7 Claims, 5 Drawing Sheets

POWER SUPPLY UNIT AND POWER SUPPLY SYSTEM FOR SERVERS

CROSS-REFERENCE TO RELATED APPLICATION

This patent application is related to a patent application, having Ser. No. 13/332,546, entitled "POWER SUPPLY UNIT AND POWER SUPPLY SYSTEM FOR SERVERS", filed on the same date, assigned to the same assignee, and disclosure of which is incorporated herein by reference in its entirety.

BACKGROUND

1. Technical Field

The disclosure generally relates to power supply units, and particularly relates to a power supply unit for providing power to servers and a power supply system for servers.

2. Description of Related Art

Electrical devices, such as a server system, employ individual power supply cables to provide power for a number of servers. Therefore, each of the servers has to be equipped with an individual transformer and an individual rectification. Requiring individual transformers and individual rectifications may complicate structures of the servers. Having complicated structures inside the server is not only hard to manage, but also inconvenient to maintain.

Therefore, a power supply unit is desired to overcome the above described shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

An embodiment of a power supply unit will be described with reference to the drawings.

Figure 1:
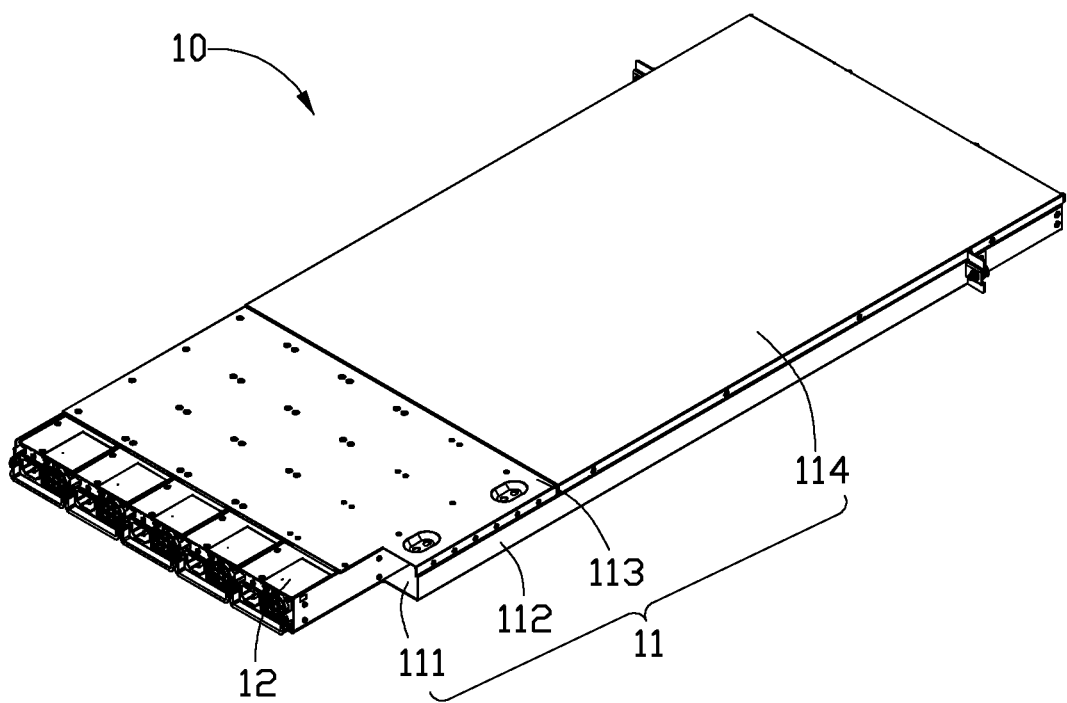
FIG. 1 is an isometric view of a power supply unit in accordance with an embodiment of the present disclosure.
Figure 2:
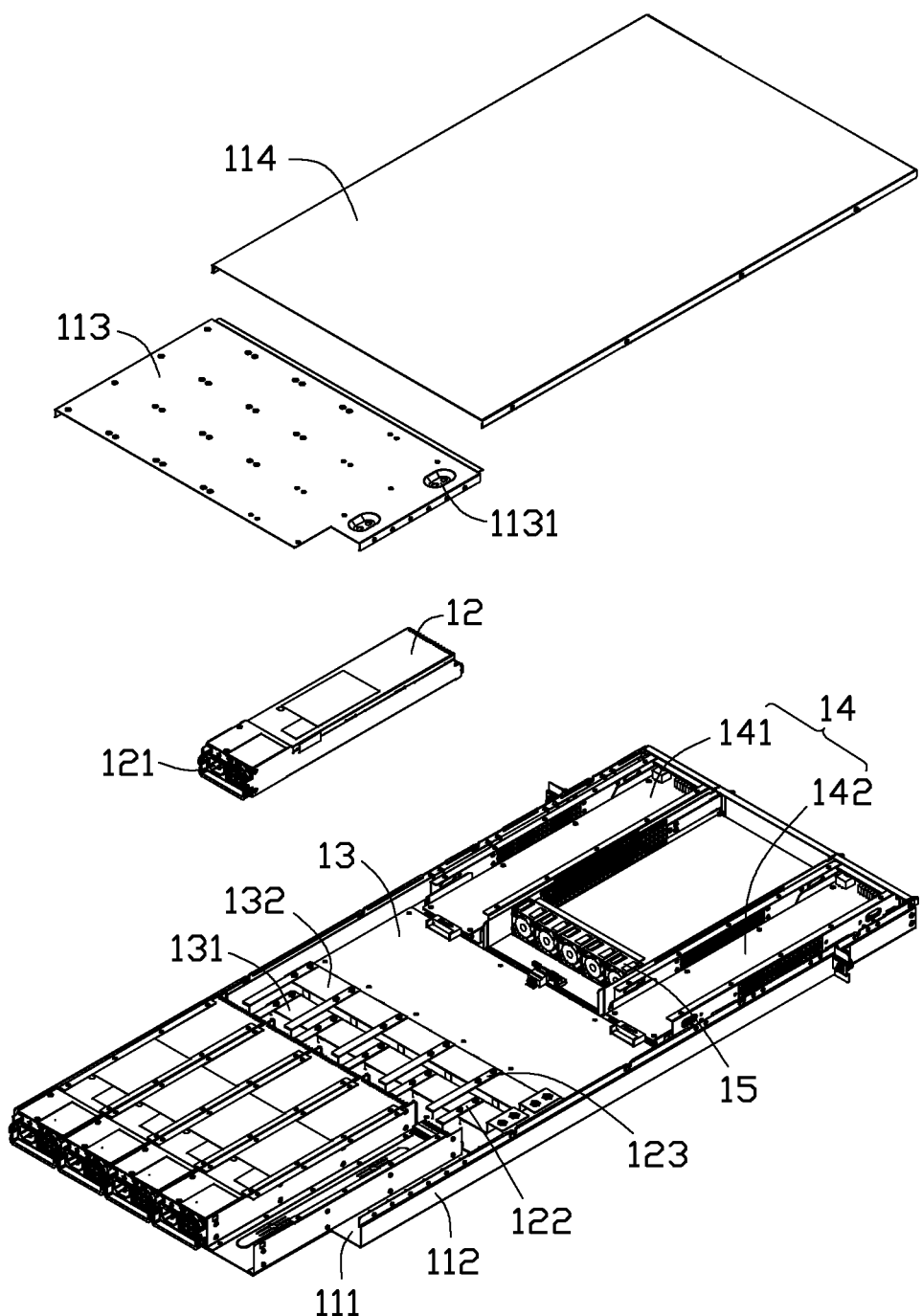
FIG. 2 is an exploded view of the power supply unit in FIG. 1.

Referring to FIGS. 1-2, a power supply unit 10 for providing power to servers includes a housing 11, a plurality of power supplies 12 assembled inside the housing 11, a circuit board 13 electrically connected to the plurality of power supplies 12, an integrated management module 14 electrically connected with the circuit board 13, and a cooling fan 15 electrically connected with the circuit board 13.

The housing 11 is rectangular, and includes a bottom plate 111 and side walls 112. The bottom plate 111 and side walls 112 cooperatively define a receiving space for the plurality of power supplies 12, the circuit board 13, the integrated management module 14 and the cooling fan 15. The circuit board 13 is positioned in the middle of the housing 11. The integrated management module 14 and the plurality of power supplies 12 are separately positioned at two opposite ends of the circuit board 13. The housing 11 further includes a first cover plate 113 and a second cover plate 114. The first cover plate 113 is directly above the plurality of power supplies 12. The second cover plate 114 is directly above the circuit board 13, the integrated management module 14 and the cooling fan 15. One end of the first cover plate 113 is adjacent to the side walls 112 and includes two securing sections 1131.

The plurality of power supplies 12 are arranged at a rear end of the power supply unit 10. Each of the plurality of power supplies 12 has an input end for connecting to an external power source(s). The plurality of power supplies 12 receive a 220V AC voltage from an input end 121 and convert the 220V AC voltage into a 12V DC voltage. Output ends of the plurality of power supplies 12 are electrically connected to the circuit board 13 by PCEI interfaces, and after integration by the circuit board 13, the 12V DC voltage is output between the first output end 122 and the second output end 123. The plurality of power supplies 12 are arranged in a redundant array of N+1, wherein N is an integer greater than 1. N represents the number of the plurality of power supplies 12 assembled together to meet total power requirement of servers. For example, if it needs four of the plurality of power supplies 12 to meet the total power requirement of servers, the total number of the plurality of power supplies 12 will be five. In that situation, when any one of the plurality of power supplies 12 is out of service, remaining of the plurality of power supplies 12 can still meet the power requirement of the servers.

The circuit board 13 is electrically connected to the plurality of power supplies 12 and the integrated management module 14. The circuit board 13 includes a first conductive plate 131 and a second conductive plate 132 arranged parallel to the first conductive plate 131. The first output end 122 of each of the plurality of power supplies 12 is connected to the first conductive plate 131, and the second output end 123 of each of the plurality of power supplies 12 is connected to the second conductive plate 132. The first conductive plate 131 and the second conductive plate 132 are electrically connected to the servers, thereby making power available to the servers. In this embodiment, the first conductive plate 131 and the second conductive plate 132 are both copper.

The integrated management module 14 is positioned at a front side of the power supply unit 10, to monitor the operational status of the plurality of power supplies 12. The integrated management module 14 can further include LED indicators to indicate the working conditions of the plurality of power supplies 12. In this embodiment, the integrate management module 14 includes a first power management unit 141 and a second power management unit 142. The first power management unit 141 and the second power management unit 142 are positioned at two opposite sides of the front end of the power supply unit 10. Either of the first power management unit 141 and the second power management unit 142 can monitor the operation of the plurality of power supplies 12 individually. If the first power management unit 141 fails, the second power management unit 142 can keep working without interrupting the power supplied to the servers. Similarly, if the second power management unit 142 fails, the first power management unit 141 can keep working without interrupting the power supplied to the servers.

The cooling fan 15 is disposed between the first power management unit 141 and the second power management unit 142. The cooling fan 15 is electrically connected to the circuit board 13 and actively dissipates heat from the plurality of power supplies 12, the circuit board 13 and the integrated management module 14.

Figure 3:
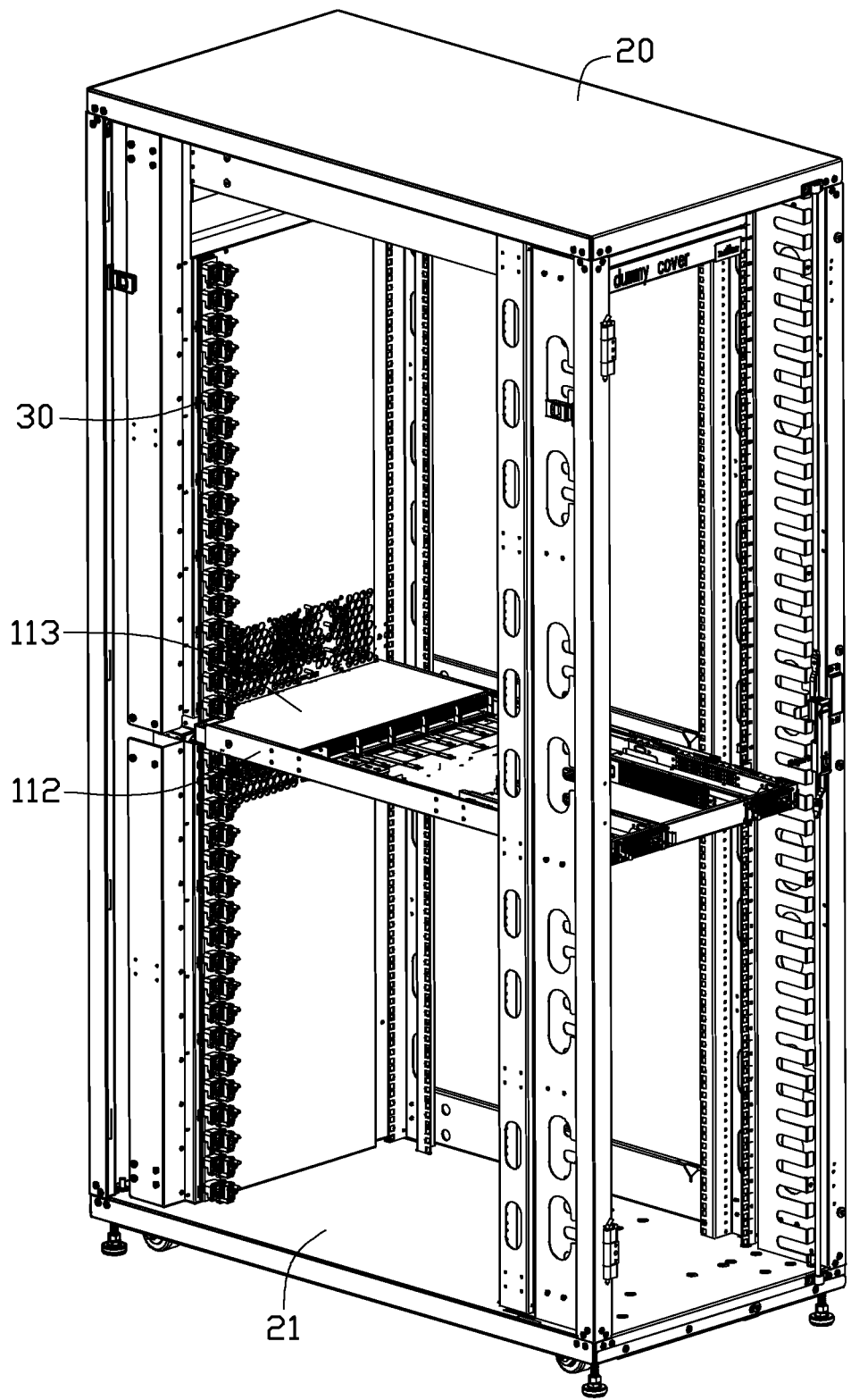
FIG. 3 is an isometric view of the power supply unit in FIG. 1 applied to a server cabinet.

The power supply unit 10 can be applied to a power supply system for a server cabinet. Referring to FIG. 3, the power supply system for a server cabinet includes a cabinet 20, the power supply unit 10 and a power supply device 30. A plurality of servers (not shown) is positioned inside the cabinet 20. The power supply unit 10 provides power to the servers by means of the power supply device 30.

The cabinet 20 includes a base 21. The power supply unit 10 is inserted into the cabinet 20 along a direction parallel to the base 21. In this embodiment, the power supply unit 10 is positioned in the middle of the cabinet 20. The servers can be positioned above or below the power supply unit 10. A height of the power supply unit 10 is substantially the same as that of the server, generally about 1 U (44.45 mm) in a dimensional classification, therefore the power supply unit 10 can be installed into any space which might otherwise be allocated to a server in the cabinet 20.

Figure 4:
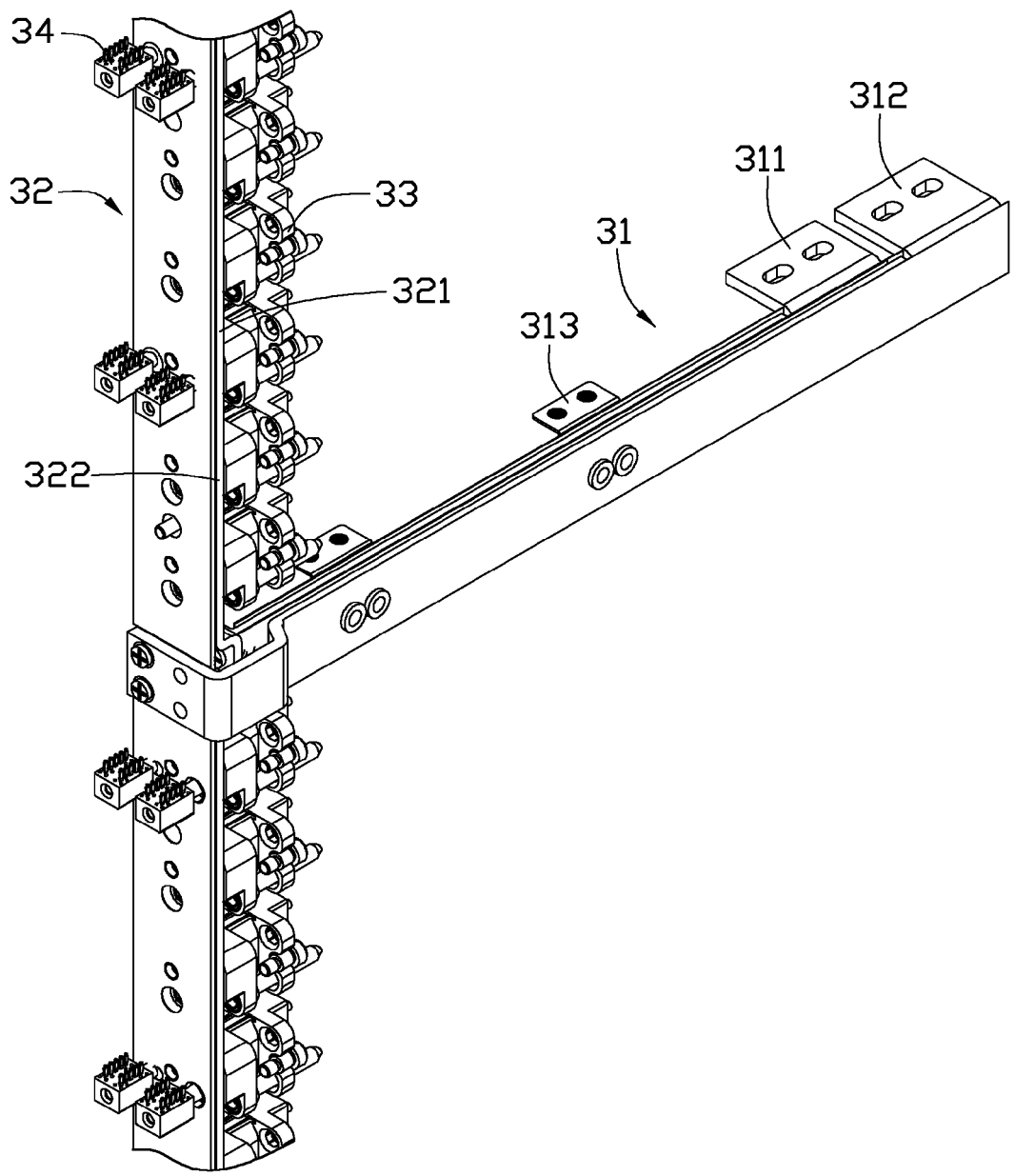
FIG. 4 is an isometric view of a power supply device in FIG. 3.
Figure 5:
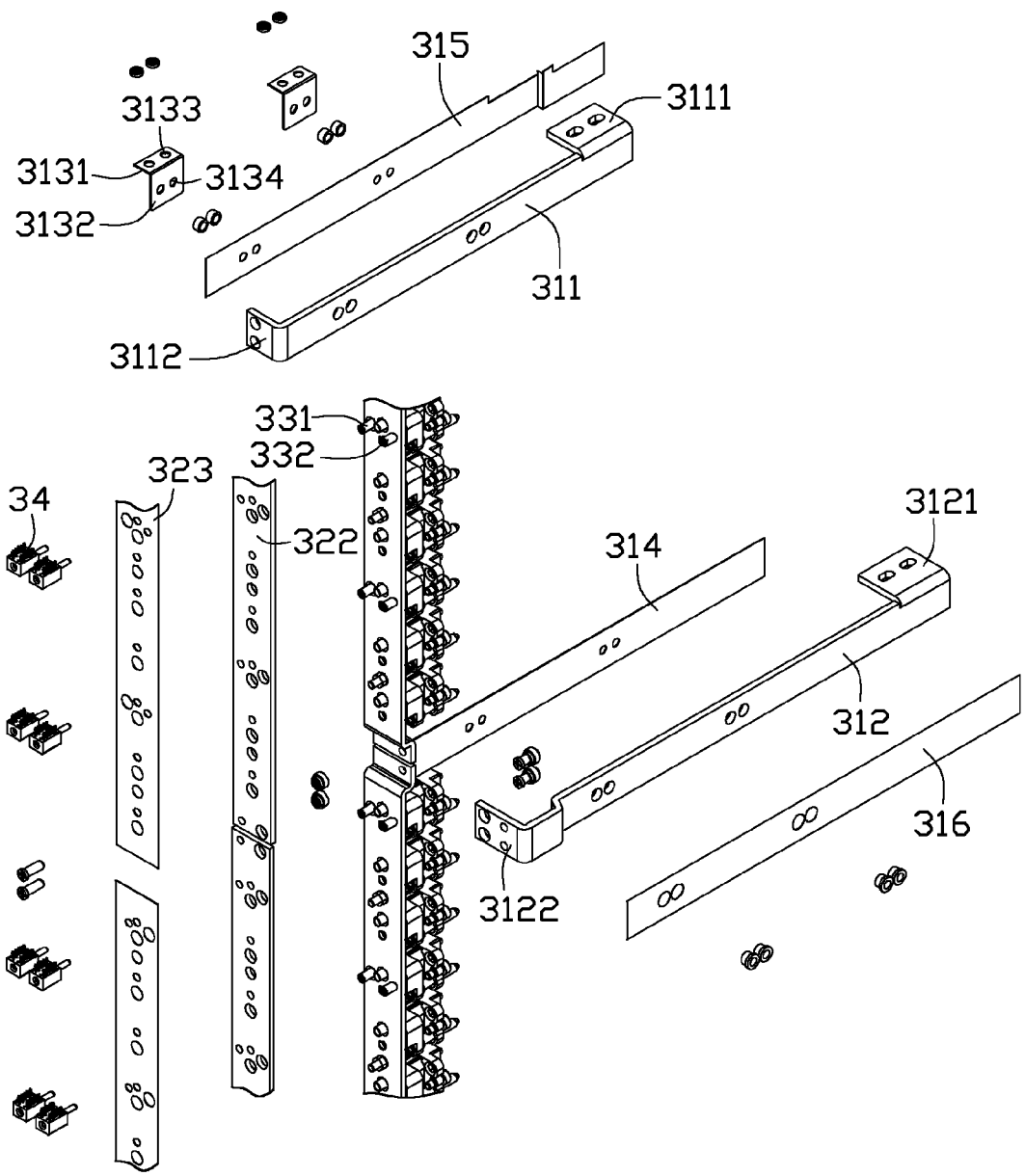
FIG. 5 is an exploded view of the power supply device in FIG. 4.

Referring to FIGS. 4-5, the power supply device 30 includes a primary current conductive structure 31, a secondary current conductive structure 32 electrically connected with the primary current conductive structure 31 and a plurality of connectors 33.

The primary current conductive structure 31 includes a first primary current conductive strip 311, a second primary current conductive strip 312 and a securing element 313 to connect the second primary current conductive strip 312 with the first primary current conductive strip 311. The first primary current conductive strip 311 and the second primary current conductive strip 312 are elongated copper strips. In this embodiment, the first primary current conductive strip 311 and the second primary current conductive strip 312 are thin plates attached to each other. The first primary current conductive strip 311 includes a first current-guiding section 3111 and a first assembly section 3112. The first current-guiding section 3111 is electrically connected with the first conductive plate 131 of the power supply unit 10. The second primary current conductive strip 312 includes a second current-guiding section 3121 and a second assembly section 3122. The second current-guiding section 3121 is electrically connected with the second conductive plate 132 of the power supply unit 10. The securing element 313 includes a first securing plate 3131 and a second securing plate 3132. The first securing plate 3131 defines two first securing holes 3133 therein. Positions of the two first securing holes 3133 corresponds to positions of the two securing sections 1131 in the first cover plate 113. The second securing plate 3132 defines two second securing holes 3134, and the first primary current conductive strip 311 and the second primary current conductive strip 312 also define several securing holes (not shown), thereby enabling the connection of the first primary current conductive strip 311 and the second primary current conductive strip 312 to the second securing plate 3132. The primary current conductive structure 31 further includes a spacer 314 formed between the first primary current conductive strip 311 and the second primary current conductive strip 312, thereby electrically isolating the first primary current conductive strip 311 from the second primary current conductive strip 312. A first insulating plate 315 is attached to an outer surface of the first primary current conductive strip 311 opposite to the spacer 314. A second insulating plate 316 is attached to an outer surface of the second primary current conductive strip 312 opposite to the spacer 314. In this way, an electrical short or connection between either one of the first primary current conductive strip 311 and the second primary current conductive strip 312 and the housing 11 of the power supply unit 10 is avoided. In this embodiment, the first current-guiding section 3111 extends vertically from an upper section of the first primary current conductive strip 311, and the first assembly section 3112 extends vertically from a lateral section of the first primary current conductive strip 311. The second current-guiding section 3121 extends vertically from an upper section of the second primary current conductive strip 312, and the second assembly section 3122 extends vertically from a lateral section of the second primary current conductive strip 312.

The secondary current conductive structure 32 is secured in the cabinet 20 in a direction perpendicular to the base 21. The secondary current conductive structure 32 includes a first secondary current conductive strip 321, a second secondary current conductive strip 322 and an insulating element 323. In this embodiment, the first secondary current conductive strip 321 and the second secondary current conductive strip 322 are thin plates attached to each other. The first secondary current conductive strip 321 and the second secondary current conductive strip 322 are elongated copper strips. The first secondary current conductive strip 321 acts as a positive electrode and is electrically connected to the first assembly section 3112. The second secondary current conductive strip 322 acts as a negative electrode and is electrically connected to the second assembly section 3122. The insulating element 323 covers a lateral side of the second secondary current conductive strip 322.

Each of the plurality of connectors 33 includes a first pin 331 and a second pin 332. The first pin 331 is inserted into and electrically connected to the first secondary current conductive strip 321. The second pin 332 is inserted into and electrically connected to the second secondary current conductive strip 322. The plurality of connectors 33 are uniformly disposed on the first secondary current conductive strip 321 and on the second secondary current conductive strip 322.

The power supply device 30 further includes an electrically connected device 34. An electrode which is electrically connected to the first secondary current conductive strip 321 and an electrode which is electrically connected to the second secondary current conductive strip 322 provide power for electrical devices.

In use, the plurality of power supplies 12 output a DC voltage to the circuit board 13. The DC voltage is integrated by the circuit board 13 and transmitted to the first conductive plate 131 and to the second conductive plate 132. Therefore, the DC voltage can be transmitted to the first primary current conductive strip 311 and to the second primary current conductive strip 312 by the first conductive plate 131 and by the second conductive plate 132. Then the DC voltage can be transmitted to the first secondary current conductive strip 321 by the first primary current conductive strip 311 and to the second secondary current conductive strip 322 by the second primary current conductive strip 312. After that, the DC voltage is transmitted to the first pin 331 and to the second pin 332 of each of the plurality of connector 33. The servers can obtain power from the secondary current conductive structure 32 by virtue of the plurality of connectors 33 because the first pin 331 and the second pin 332 of each of the plurality of connectors 33 are electrically connected to the servers. Any maintenance of the servers merely requires that the plurality of connectors 33 be pulled out from the servers.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A power supply system for servers, comprising:
   a cabinet for receiving the servers, the cabinet having a base;
   a power supply unit being received in the cabinet and parallel to the base, the power supply unit comprising:
      a housing;
      a plurality of power supplies arranged in the housing, the plurality of power supplies having a first output end and a second output end;
      a circuit board comprising a first conductive plate and a second conductive plate, the first conductive plate being electrically connected with the first output end, and the second conductive plate being electrically connected with the second output end; and
      an integrated management module electrically connected with the circuit board; and
   a power supply device for providing power to the servers, the power supply device comprising:
      a primary current conductive structure comprising a first primary current conductive strip and a second primary current conductive strip;
      a secondary current conductive structure being secured in the housing and perpendicular to the base, the secondary current conductive structure comprising a first secondary current conductive strip and a second secondary current conductive strip, the first secondary current conductive strip being electrically connected with the first conductive plate through the first primary current conductive strip, and the second secondary current conductive strip being electrically connected with the second conductive plate through the second primary current conductive strip; and
      a plurality of connectors for electrically connecting the servers, each of the plurality of connectors comprising a first pin and a second pin, the first pin being inserted into and electrically connected with the first secondary current conductive strip, the second pin being inserted into and electrically connected with the second secondary current conductive strip.

2. The power supply system of claim 1, wherein the first primary current conductive strip and the second primary current conductive strip are plates and attached to each other, the first secondary current conductive strip and the second secondary current conductive strip being plates attached to each other.

3. The power supply system of claim 1, wherein the primary current conductive structure further comprises a spacer between the first primary current conductive strip and the second primary current conductive strip, the spacer is adapted to electrically insulate the first primary current conductive strip from the second primary current conductive strip.

4. The power supply system of claim 3, further comprising a first insulating plate attached to an outer surface of the first primary current conductive strip opposite to the spacer, and a second insulating plate attached to an outer surface of the second primary current conductive strip opposite to the spacer.

5. The power supply system of claim 1, wherein the secondary current conductive structure further comprises an insulating element positioned between the first secondary current conductive strip and the second secondary current conductive strip, the insulating element is adapted to electrically insulate the first secondary current conductive strip from the second secondary current conductive strip.

6. The power supply system of claim 1, wherein the plurality of connectors are disposed at one side of the secondary current conductive structure at a uniform interval.

7. The power supply system of claim 1, wherein the first primary current conductive strip comprises a first current-guiding section and a first assembly section, the first current-guiding section is electrically connected with the first conductive plate, the first assembly section is electrically connected with the first secondary current conductive strip; the second primary current conductive strip comprises a second current-guiding section and a second assembly section, the second current-guiding section is electrically connected with the second conductive plate, and the second assembly section is electrically connected with the second secondary current conductive strip.

* * * * *